US012688963B2

(12) United States Patent
Elian et al.

(10) Patent No.: US 12,688,963 B2
(45) Date of Patent: Jul. 21, 2026

(54) OPERATING ELEMENT HAVING HAPTIC FEEDBACK

(71) Applicant: Infineon Technologies AG, Neubiberg (DE)

(72) Inventors: Klaus Elian, Alteglofsheim (DE); Derek Debie, Bogen (DE)

(73) Assignee: Infineon Technologies AG, Neubiberg (DE)

( * ) Notice: Subject to any disclaimer, the term of this patent is extended or adjusted under 35 U.S.C. 154(b) by 178 days.

(21) Appl. No.: 18/508,574

(22) Filed: Nov. 14, 2023

(65) Prior Publication Data

US 2024/0170197 A1      May 23, 2024

(30) Foreign Application Priority Data

Nov. 21, 2022      (DE) ......................... 102022130682.8

(51) Int. Cl.
| | |
|---|---|
| *H01F 27/28* | (2006.01) |
| *H05K 1/02* | (2006.01) |
| *H05K 7/14* | (2006.01) |

(52) U.S. Cl.
CPC ....... *H01F 27/2804* (2013.01); *H05K 1/0277* (2013.01); *H05K 7/1427* (2013.01); *H05K 2201/10151* (2013.01)

(58) Field of Classification Search
CPC .................................................... H01F 27/2804

USPC .......................................................... 361/749
See application file for complete search history.

(56) References Cited

U.S. PATENT DOCUMENTS

| | | | |
|---|---|---|---|
| 2005/0275497 A1 | 12/2005 | Ramadan et al. | |
| 2009/0026560 A1* | 1/2009 | Wombacher ............ | H01L 24/83 |
| | | | 257/E31.117 |
| 2012/0019999 A1* | 1/2012 | Yao Shao ........... | G06F 3/03547 |
| | | | 200/329 |
| 2021/0278966 A1 | 9/2021 | Rosenberg et al. | |
| 2022/0334645 A1* | 10/2022 | Junus ...................... | G06F 3/045 |
| 2022/0357225 A1* | 11/2022 | Beker ....................... | G01L 1/22 |

FOREIGN PATENT DOCUMENTS

| | | |
|---|---|---|
| DE | 10103563 A1 | 8/2002 |
| DE | 102008046102 B4 | 5/2016 |
| DE | 102017130331 A1 | 6/2019 |
| WO | 2017171757 A1 | 10/2017 |
| WO | 2022006561 A1 | 1/2022 |
| WO | 2022076480 A1 | 4/2022 |

* cited by examiner

*Primary Examiner* — Stanley Tso
(74) *Attorney, Agent, or Firm* — Harrity & Harrity, LLP

(57) ABSTRACT

An operating element having haptic feedback is proposed, having a membrane deflectable using a magnetic field, having a coil for generating a magnetic field for deflecting the membrane, and having a touch sensor element including at least one touch sensor electrode.

23 Claims, 3 Drawing Sheets

100

104         101   103

100

104     102     105   101   103

100

104     102     105   101

400

404   411   402          405   401   403          410

500

504   511   502          505   501   503          510

600

604   611   602   606   605   601   603          610

700

712          702          705   701   703   709          707   708

800

812          802          805   801   803   809          807   808

OPERATING ELEMENT HAVING HAPTIC FEEDBACK

CROSS-REFERENCE TO RELATED APPLICATION

This application claims priority to German Patent Application No. 102022130682.8 filed on Nov. 21, 2022, the content of which is incorporated by reference herein in its entirety.

TECHNICAL FIELD

The present disclosure relates to an operating element having haptic feedback.

BACKGROUND

Operating elements of motor vehicles contribute significantly to the driving experience, independently of the selected type of the drive. The appearance, the haptics, and the manner of the interaction give vehicle producers the possibility of standing out from market competitors with the operating elements of vehicles.

An electromagnetic haptic actuator is described in WO 2017/171757 A1, which is integrated in a multilayer substrate. In one example, the haptic actuator has an inductive coil, which is formed in a housing substrate material, an elastic membrane above the coil, a magnet on the membrane, and a power supply level, which supplies a control signal to move the magnet toward and away from the coil.

A method for producing planar micro-coils in or on a silicon substrate having coil windings having high aspect ratio (>3) and a large variety of geometric shapes is disclosed in US 2005/0275497 A1. The micro-coils can be formed on a silicon substrate and embedded in a dielectric material, or they can be formed in trenches within a silicon substrate. The micro-coils can have field-amplifying ferromagnetic columns, which protrude above the micro-coil level and are formed at positions of maximum magnetic field strength, and the micro-coils can also contain magnetic layers which are formed under the substrate and touch the columns, in order to form an essentially closed path for the magnetic flux. The substrate can be thinned to membrane proportions. These micro-coils generate strong magnetic fields having strong field gradients and can be used in a variety of processes, which require strong magnetic forces to be exerted in small intervals or magnetic depressions to be created to capture and manipulate small particles.

The dimensions of known switches having haptic feedback often result in challenges upon the integration thereof in modern vehicle cockpits.

SUMMARY

Proceeding therefrom, the present implementation is based on the object of specifying an operating element having haptic feedback, which may be integrated easily into modern vehicle cockpits.

This object was achieved by the subject matter of the main claim. Advantageous implementations are specified in the dependent claims.

An operating element having haptic feedback is proposed, having a membrane deflectable using a magnetic field, having a coil for generating a magnetic field for deflecting the membrane, and having a touch sensor element including at least one touch sensor electrode.

BRIEF DESCRIPTION OF THE DRAWINGS

Designs of the proposed sensor will now be explained in more detail based on the drawings. In the figures.

DETAILED DESCRIPTION

Figure 1:
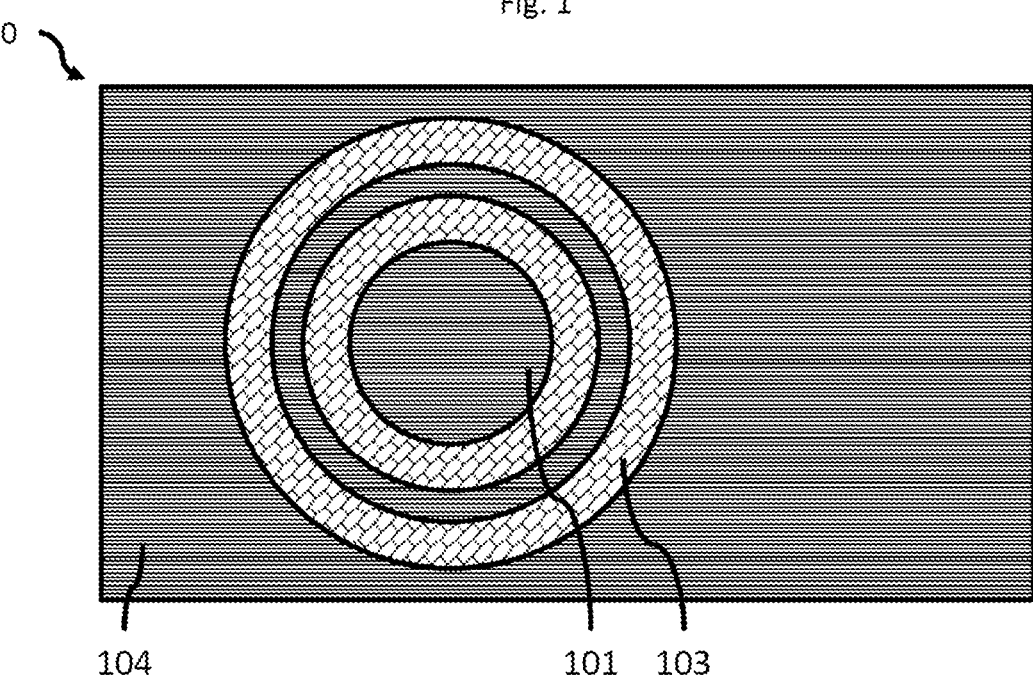
FIG. 1 shows an operating element having haptic feedback from the front side.
Figure 2:
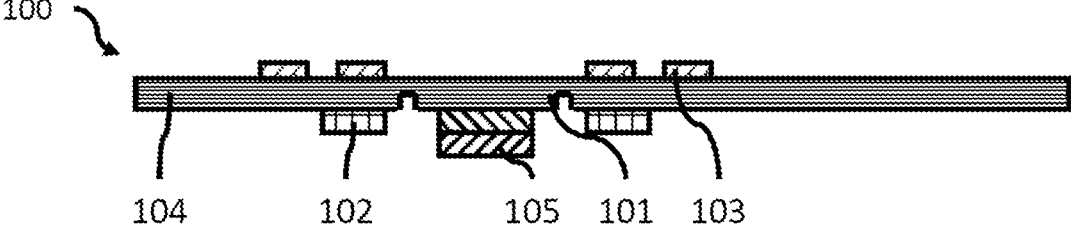
FIG. 2 shows the operating element having haptic feedback shown in FIG. 1, in cross section.
Figure 3:
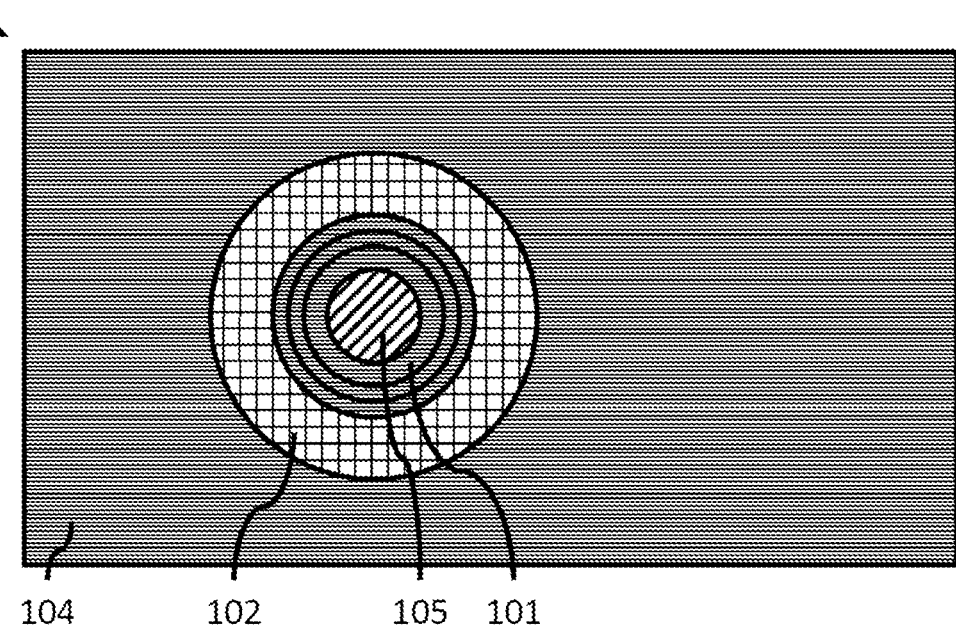
FIG. 3 shows the operating element having haptic feedback shown in FIGS. 1 and 2, from the rear side.

An operating element 100 is shown from the front side, in cross section, and from the rear side in FIGS. 1 to 3. The operating element 100 has a membrane 101 deflectable using a magnetic field. Furthermore, the operating element 100 comprises a coil 102 for generating the magnetic field for deflecting the membrane 101. Finally, a touch sensor element having at least one touch sensor electrode 103 is provided. A touch of the operating element can be detected using the touch sensor element. The coil 102 can then be activated so that the membrane 101 is deflected and the user touching the operating element is therefore given haptic feedback.

The touch sensor electrode 103 can laterally enclose the membrane 401. In this way, an improved spatial association of the haptic feedback with the touch can take place. It is also conceivable to arrange at least one touch sensor electrode on the membrane. In particular, the touch sensor electrode can be arranged centrally, for example, in the middle of the membrane.

The haptic feedback can be a vibration of the membrane 401. It is also conceivable that a single movement pulse of the membrane 401 represents the haptic feedback. The deflection during the vibration and/or the movement pulse can in particular be less than 1 mm.

The membrane 401 can in particular be resonantly excited for strong haptic feedback and can be excited outside the resonance range for weak haptic feedback. It is conceivable to provide additional elements (such as masses) to set the resonance frequency of the membrane 401.

The touch sensor element can in particular be a capacitive touch sensor element. However, it is also conceivable to provide a resistive touch sensor element.

The operating element 100 can comprise a flexible printed circuit board (PCB) 104, wherein the deflectable membrane 101 is part of the printed circuit board 104. For example, sections of the printed circuit board 104 can be deliberately thinned to form the deflectable membrane 101.

The touch sensor electrode 103 can be formed on a front side of the printed circuit board 104. Alternatively or additionally, the coil 102 can be formed on a rear side of the printed circuit board 104. Normal techniques of printed circuit board production can be used here. For example, the touch sensor electrode 103 and/or the coil 102 can be formed as an imprint on the printed circuit board 104. This can enable a cost-effective production of the operating element 100.

The printed circuit board 104 can in particular be a single-layer printed circuit board 104.

A magnetic material can be applied to the rear side of the membrane 101. The material can be a soft-magnetic material or a hard-magnetic material. A material having a coercive field strength of less than 1 kA/m can be designated as a soft-magnetic material. A material having a coercive field strength of greater than 1 kA/m can be designated as a hard-magnetic material.

In the example implementation shown in FIGS. 1 to 3, the magnetic material is already magnetized. The magnetic material can be designated as a magnet. This is indicated in FIG. 3 by different hatching for the two poles of the magnets.

Figure 4:
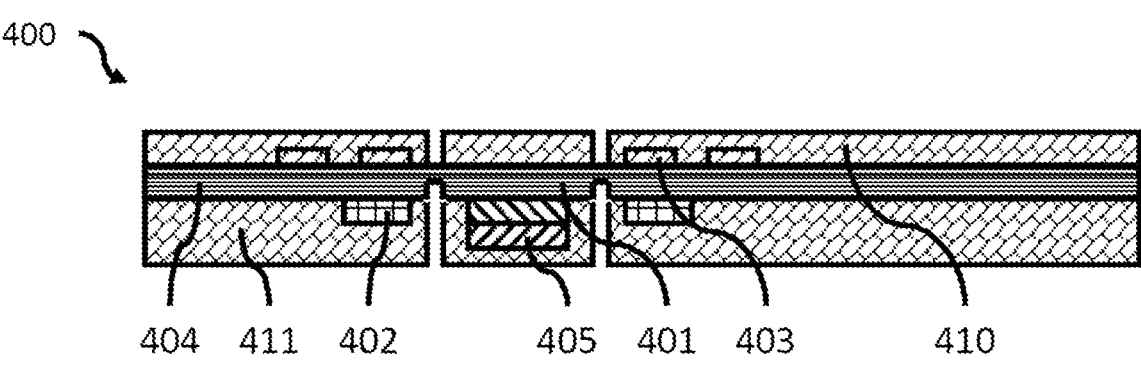
FIG. 4 shows an operating element having haptic feedback in cross section.

A further operating element 400 having haptic feedback is shown in FIG. 4. The operating element 400 has a membrane 401 deflectable using a magnetic field, a coil 402 for generating the magnetic field for deflecting the membrane 401, and a touch sensor element comprising at least one touch sensor electrode 403. The operating element 400 has a flexible printed circuit board 404, wherein the deflectable membrane 401 is part of the printed circuit board. The touch sensor electrode 403 is formed on a front side of the printed circuit board 404 and the coil 402 is formed on a rear side of the printed circuit board 404. The touch sensor electrode 403 and the coil 402 can in particular be printed on. Furthermore, coatings 410 and/or 411 can be provided on the front or rear side of the printed circuit board 404, in order to protect the touch sensor electrode 403 or the coil 402 from environmental influences. It is also conceivable to provide the touch sensor electrode 403 and/or the coil 402 as an inner layer in the printed circuit board 404. Typical methods for printed circuit board production can be used for this purpose. A hard-magnetic material 405, in particular a magnet, is applied to the rear side of the membrane 402.

Figure 5:
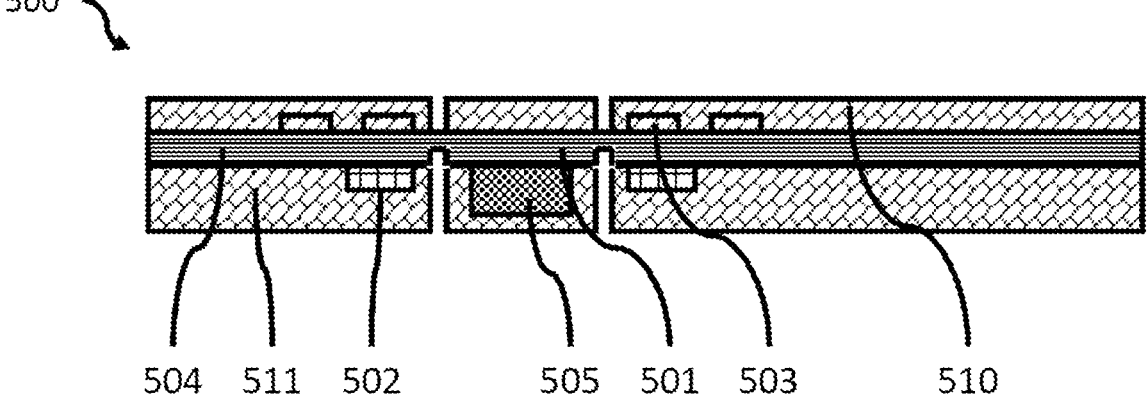
FIG. 5 shows an operating element having haptic feedback in cross section.

An operating element 500 having haptic feedback is also shown in FIG. 5. The operating element 500 comprises a membrane 501 deflectable using a magnetic field, a coil 502 for generating a magnetic field for deflecting the membrane 501, and a touch sensor element comprising at least one touch sensor electrode 503. The membrane 501 is configured as part of a printed circuit board 504, on which the touch sensor electrode 503 is printed on the front side and the coil 502 is printed on the rear side. The touch sensor electrode 503 and the coil 502 are protected from environmental influences by coatings 510 and 511. A soft-magnetic, non-magnetized material 505 is applied to the rear side of the membrane 501, in order to interact with the magnetic field generated by the coil 502 for haptic feedback. Dispensing with magnetization of the magnetic material 505 can in particular avoid influencing other elements in the vicinity due to a permanent magnetic field. Moreover, such an operating element 500 can be produced more cost-effectively. Furthermore, a nonmagnetic operating element 500 typically attracts fewer particles.

Figure 6:
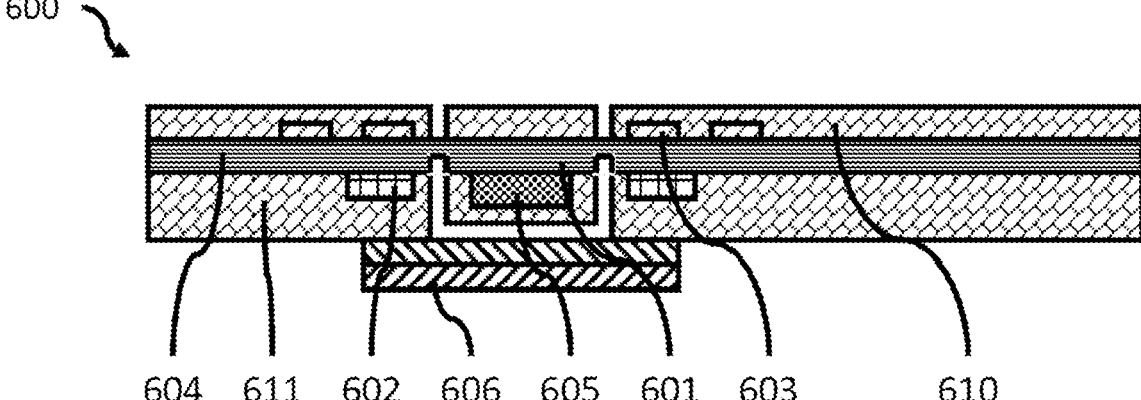
FIG. 6 shows an operating element having haptic feedback in cross section.

The operating element 600 having haptic feedback, which is shown in FIG. 6, has a membrane 601 deflectable using a magnetic field, a coil 602 for generating a magnetic field for deflecting the membrane 601, and a touch sensor element comprising at least one touch sensor electrode 503. A printed circuit board 604 is provided, in which the membrane 601 is formed. The touch sensor electrode 603 and the coil 602 are applied to the printed circuit board 604 and protected using coatings 610, 611. A magnetic material 605 is applied to the rear side of the membrane 601. Furthermore, a bias magnet 606 is provided, using which the electromagnetic properties of the operating element 600 can be set.

Figure 7:
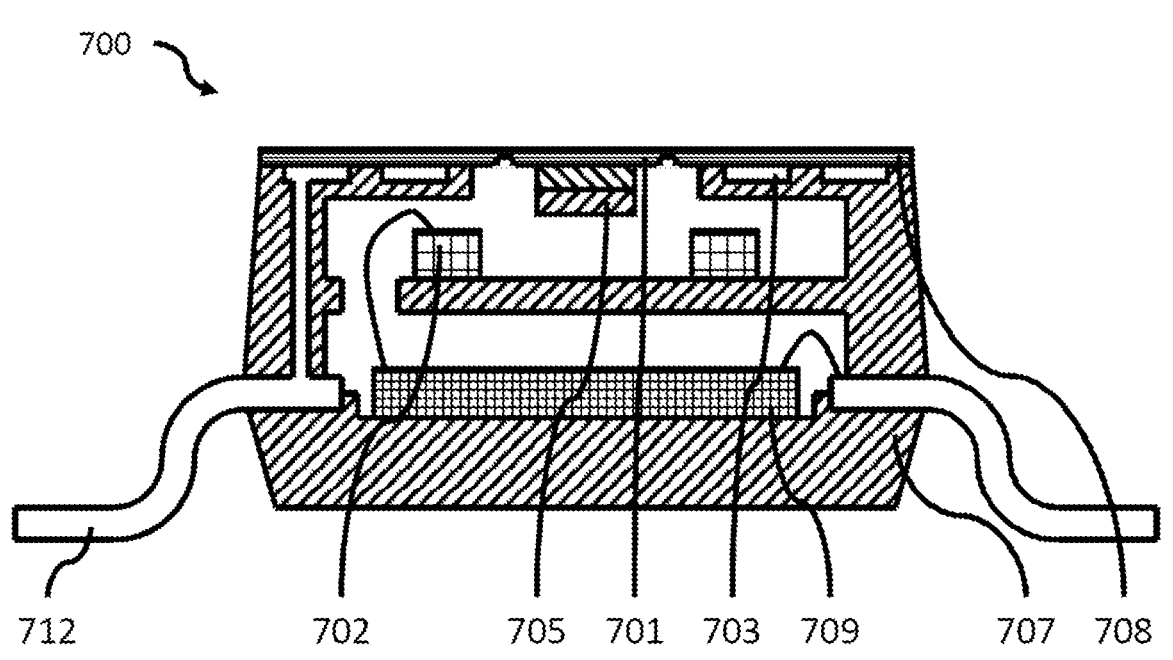
FIG. 7 shows an operating element having haptic feedback in cross section.

FIG. 7 shows an operating element 700, which is provided in the form of a so-called "solid cavity package". The operating element 700 having haptic feedback comprises a membrane 701 deflectable using a magnetic field, a coil 702 for generating a magnetic field for deflecting the membrane 701, and a touch sensor element having at least one touch sensor electrode 703. The operating element 700 in particular comprises a prefinished housing 707, wherein the membrane 701 forms a part of a cover 708 of the housing 707. The housing 707 can be in particular a DSOF housing. The cover 708 can seal off the housing 707.

The operating element 700 can comprise a lead frame 712. The touch sensor electrode 703 can be part of the lead frame 712. It is also conceivable to establish the connection of the touch sensor electrode 703 to the lead frame 712 using an etched through contact, a galvanically deposited conductive material, and/or an imprinted conductive material.

An integrated circuit 709 is provided in the housing 707, using which signals of the touch sensor element can be evaluated and the coil 702 can be activated to effectuate the haptic feedback. The coil 702 can be provided in the housing 707. The coil 702 can be arranged at a distance from the cover 708. The operating element shown in FIG. 7 has a magnet 705 on the rear side of the membrane 701, in order to be able to deflect it using the coil 702.

Figure 8:
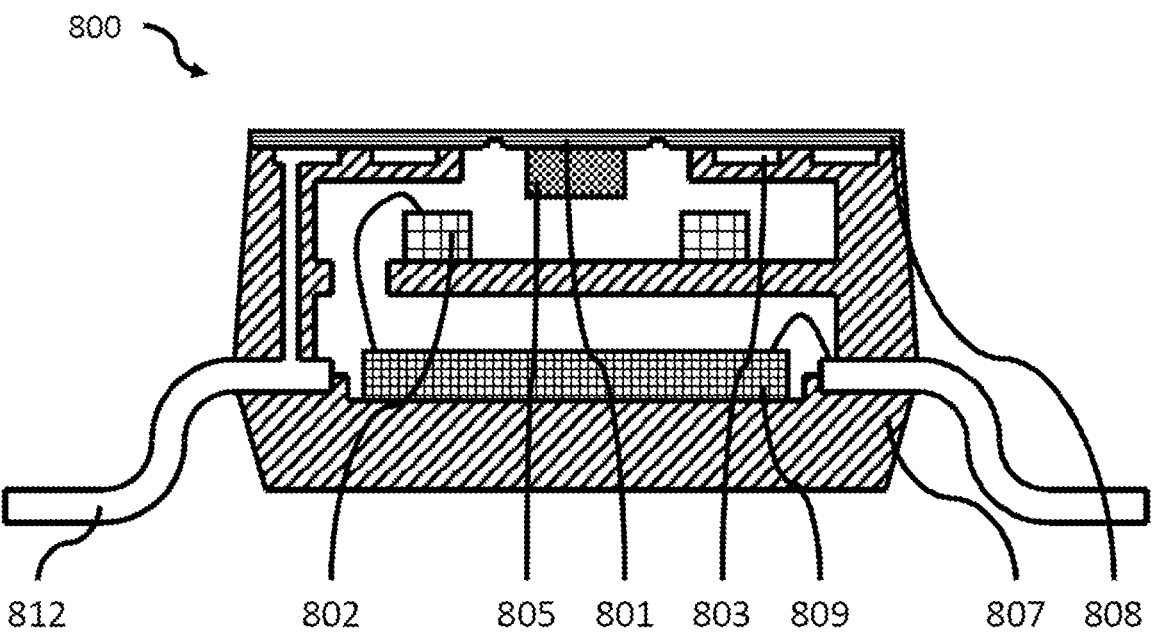
FIG. 8 shows an operating element having haptic feedback in cross section.

FIG. 8 shows an operating element 800 which is very similar to that of FIG. 7. In particular, the elements 812, 802, 801, 803, 809, 807, 808 correspond to the elements 712, 702, 701, 703, 709, 707, 708. In contrast to the example of FIG. 7, the operating element 800 does not have a magnet, but rather a soft-magnetic material on the rear side of the membrane.

ASPECTS

Several example implementations will be defined by the following aspects:

ASPECT 1. Operating element (100, 400, 500, 600, 700, 800) having haptic feedback having a membrane (101, 401, 501, 601, 701, 801) deflectable using a magnetic field, having a coil (102, 402, 502, 602, 702, 802) for generating a magnetic field for deflecting the membrane (101, 401, 501, 601, 701, 801), and having a touch sensor element comprising at least one touch sensor electrode (103, 403, 503, 603, 703, 803).

ASPECT 2. Operating element (100, 400, 500, 600, 700, 800) according to ASPECT 1, wherein the touch sensor electrode (103, 403, 503, 603, 703, 803) laterally surrounds the membrane (101, 401, 501, 601, 701, 801), and/or wherein the touch sensor electrode is arranged on the membrane, in particular centrally.

ASPECT 3. Operating element (100, 400, 500, 600, 700, 800) according to ASPECT 1 or 2, wherein the touch sensor element is a capacitive touch sensor element.

ASPECT 4. Operating element (100, 400, 500, 600, 700, 800) according to any one of ASPECTS 1 to 3, wherein the touch sensor element is a resistive touch sensor element.

ASPECT 5. Operating element (100, 400, 500, 600) according to any one of ASPECTS 1 to 4, having a flexible printed circuit board (104, 404, 504, 604), wherein the deflectable membrane (101, 401, 501, 601) is part of the printed circuit board.

ASPECT 6. Operating element (100, 400, 500, 600) according to any one of ASPECTS 1 to 5, wherein the touch sensor electrode (103, 403, 503, 603) is formed on a front side of the printed circuit board (104, 404, 504, 604).

ASPECT 7. Operating element (100, 400, 500, 600) according to ASPECT 6, wherein the coil (102, 402, 502, 602) is formed on a rear side of the printed circuit board (104, 404, 504,604).

ASPECT 8. Operating element (100, 400, 500, 600) according to ASPECT 6 or 7, wherein the touch sensor electrode (103, 403, 503, 603) and/or the coil (102, 402, 502, 602) is formed as an imprint on the printed circuit board (104, 404, 504, 604).

ASPECT 9. Operating element (100, 400, 500, 600) according to any one of ASPECTS 5 to 7, wherein the printed circuit board (104, 404, 504, 604) is single-layer.

ASPECT 10. Operating element (100, 400, 500, 600, 700, 800) according to any one of ASPECTS 1 to 9, wherein a magnetic material (105, 405, 605, 705, 805), in particular a soft-magnetic material or a hard-magnetic material, is applied to the rear side of the membrane (101, 401, 501, 601, 701, 801).

ASPECT 11. Operating element (100, 400, 500, 600, 700, 800) according to any one of ASPECTS 1 to 10, wherein the magnetic material (105, 405, 705) is magnetized.

ASPECT 12. Operating element (600) according to either of ASPECTS 10 and 11, wherein the operating element (606) comprises a bias magnet (606).

ASPECT 13. Operating element (700, 800) according to any one of ASPECTS 1 to 12, wherein the operating element (700, 800) comprises a prefinished housing (707, 807), wherein the membrane (701, 801) forms a part of a cover (708, 808) of the housing (707, 807).

ASPECT 14. Operating element (700, 800) according to ASPECT 13, wherein the prefinished housing (707, 807) is a DSOF housing.

ASPECT 15. Operating element (700, 800) according to any one of ASPECTS 1 to 14, wherein the operating element (700, 800) comprises an integrated circuit (709, 809).

Although specific example implementations have been illustrated and described in this description, persons with typical knowledge in the art will recognize that a variety of alternative and/or equivalent implementations can be selected as a substitution for the specific example implementations which are shown and described in this description without deviating from the scope of the implementation shown. It is the intention that this application covers all adaptations or variations of the specific example implementations which are discussed here. It is therefore intended that this implementation only be restricted by the claims and the equivalents of the claims.

The invention claimed is:

1. An operating element having haptic feedback, the operating element comprising:
  a membrane that is deflectable using a magnetic field, wherein the membrane comprises a deflectable material, and wherein the haptic feedback is a vibration or a movement pulse of the deflectable material,
  a coil configured to generate the magnetic field for deflecting the membrane, a touch sensor element comprising at least one touch sensor electrode, wherein each touch sensor electrode of the at least one touch sensor electrode has a ring-shape that laterally surrounds the membrane, and
  a magnetic material directly attached to the membrane.

2. The operating element as claimed in claim 1, wherein the touch sensor element is a capacitive touch sensor element or a resistive touch sensor element.

3. The operating element as claimed in claim 1, the operating element further comprising:
  a flexible printed circuit board,
  wherein the membrane is a deflectable part of the flexible printed circuit board,
  wherein the at least one touch sensor electrode is arranged on a front side of the flexible printed circuit board, and
  wherein the coil is arranged on a rear side of the flexible printed circuit board.

4. The operating element as claimed in claim 3, wherein one or more of the at least one touch sensor electrode or the coil is formed as an imprint on the flexible printed circuit board.

5. The operating element as claimed in claim 3, wherein the flexible printed circuit board is a single-layer printed circuit board.

6. The operating element as claimed in claim 3, wherein the magnetic material is applied to the membrane at the rear side of the flexible printed circuit board, and
  wherein the magnetic material comprises a soft-magnetic material or a hard-magnetic material.

7. The operating element as claimed in claim 6, wherein the magnetic material is magnetized.

8. The operating element as claimed in claim 6, wherein the operating element comprises a bias magnet arranged in an overlapping position with the magnetic material.

9. The operating element as claimed in claim 1, wherein the operating element comprises a prefinished housing, wherein the membrane forms a part of a cover of the prefinished housing.

10. The operating element as claimed in claim 9, wherein the prefinished housing is a DSOF housing.

11. The operating element as claimed in claim 1, wherein the operating element comprises an integrated circuit.

12. The operating element as claimed in claim 1, wherein each touch sensor electrode of the at least one touch sensor electrode fully encircles the membrane.

13. The operating element as claimed in claim 1, wherein the at least one touch sensor electrode includes a plurality of touch sensor electrodes formed as concentric rings.

14. The operating element as claimed in claim 1, wherein the coil has a ring-shape that fully encircles the membrane.

15. The operating element as claimed in claim 14, wherein a touch sensor electrode of the at least one touch sensor electrode is concentric with the coil.

16. The operating element as claimed in claim 1,
  wherein the magnetic material is centrally located on the membrane,
  wherein each touch sensor electrode of the at least one touch sensor electrode laterally surrounds the magnetic material.

17. The operating element as claimed in claim 1, further comprising:
  a flexible printed circuit board, wherein the membrane is deflectable part of the flexible printed circuit board,
  wherein the at least one touch sensor electrode is arranged on a front side of the flexible printed circuit board, and wherein the coil is arranged on a rear side of the flexible printed circuit board and has a ring-shape that laterally surrounds the membrane.

18. The operating element as claimed in claim 17, wherein the magnetic material is directly attached to the membrane at the rear side of the flexible printed circuit board, the magnetic material being centrally located on the membrane, and wherein each touch sensor electrode of the at least one touch sensor electrode laterally surrounds the magnetic material.

19. The operating element as claimed in claim 18, wherein the coil has a ring-shape that fully encircles the membrane and the magnetic material.

20. The operating element as claimed in claim 1, wherein the magnetic material is configured to interact with the magnetic field for deflecting the deflectable material to produce the haptic feedback.

21. An operating element for providing haptic feedback, comprising:

a membrane that is deflectable using a magnetic field, wherein the membrane comprises a deflectable material, and wherein the haptic feedback is a vibration or a movement pulse of the deflectable material;

a magnetic material directly attached to a rear side of the membrane;

a coil configured to generate a magnetic field, wherein generating the magnetic field causes a deflection of the membrane based on the magnetic material being directly attached to the rear side of the membrane and based on an interaction of the magnetic material with the magnetic field; and a touch sensor element comprising a touch sensor electrode, wherein the touch sensor electrode has a ring-shape that laterally surrounds the membrane and the magnetic material.

22. The operating element of claim 21, further comprising:

a printed circuit board, wherein the membrane is a deflectable part of the printed circuit board.

23. The operating element of claim 22, wherein the coil is included on a rear side of the printed circuit board and the touch sensor electrode is included on a front side of the printed circuit board.

\* \* \* \* \*